United States Patent
Pylant et al.

(10) Patent No.: US 7,131,248 B2
(45) Date of Patent: Nov. 7, 2006

(54) WAFER SHIPPER WITH ORIENTATION CONTROL

(75) Inventors: James D. Pylant, Temecula, CA (US); Scott C. Bradley, Carlsbad, CA (US)

(73) Assignee: Peak Plastic & Metal Products (Int'l) Limited, Hong Kong (HK)

( * ) Notice: Subject to any disclaimer, the term of this patent is extended or adjusted under 35 U.S.C. 154(b) by 341 days.

(21) Appl. No.: 10/621,031

(22) Filed: Jul. 14, 2003

(65) Prior Publication Data

US 2005/0011808 A1   Jan. 20, 2005

(51) Int. Cl.
*B65B 35/50* (2006.01)

(52) U.S. Cl. .............. 53/447; 53/443; 53/445; 53/532; 53/540

(58) Field of Classification Search ............ 53/443, 53/445, 447, 448, 532, 535, 540; 206/710, 206/711; 438/460, 464
See application file for complete search history.

(56) References Cited

U.S. PATENT DOCUMENTS

| | | | |
|---|---|---|---|
| 4,043,451 A | | 8/1977 | Johnson ............... 206/334 |
| 5,238,876 A | * | 8/1993 | Takeuchi et al. ......... 438/464 |
| 5,570,293 A | * | 10/1996 | Tanaka et al. ............ 235/375 |
| 5,654,204 A | * | 8/1997 | Anderson ............... 438/460 |
| 5,816,410 A | * | 10/1998 | Nyseth ................. 206/711 |
| 5,960,960 A | * | 10/1999 | Yamamoto .............. 206/711 |
| 5,962,862 A | * | 10/1999 | Evers et al. ............. 250/559.4 |
| 6,119,865 A | * | 9/2000 | Kawada ................. 206/710 |
| 6,218,727 B1 | | 4/2001 | Merkl et al. ............. 257/677 |
| 6,267,245 B1 | * | 7/2001 | Bores et al. ............. 206/711 |
| 6,418,922 B1 | * | 7/2002 | Dubois et al. ........... 125/23.01 |
| 6,451,671 B1 | * | 9/2002 | Yamada ................. 438/460 |
| 6,499,602 B1 | | 12/2002 | Yajima et al. ........... 206/711 |
| 6,550,619 B1 | | 4/2003 | Bores et al. ............. 206/710 |
| 2003/0010657 A1 | | 1/2003 | Zabka et al. |
| 2003/0066780 A1 | | 4/2003 | Zabka et al. |

* cited by examiner

*Primary Examiner*—Louis Huynh
(74) *Attorney, Agent, or Firm*—Isabelle R. McAndrews

(57) ABSTRACT

An injection molded container for storing and transporting wafers includes a base having a wafer area upon which to place a stack of a plurality of wafer assemblies, wherein each wafer assembly includes a wafer frame upon which is mounted a wafer. A protective wall apparatus is positioned around the wafer area, and includes at least one wall contour artifact. Each wafer frame according to the invention includes a corresponding opposite/mating artifact. The wall apparatus and wafer frame are configured so that the wafer frame must be oriented to mate the wall and frame artifacts in order for the wafer frame to be installed in the container.

8 Claims, 6 Drawing Sheets

SECTION B-B

WAFER SHIPPER WITH ORIENTATION CONTROL

This application is related to U.S. patent application Ser. No. 10/623131 entitled "Wafer Storage Container With Wafer Positioning Posts".

BACKGROUND OF THE INVENTION

Field of the Invention

The present invention is related generally to containers for storage and shipment of wafers, and more particularly to a container for use with wafer frames upon which wafers are mounted wherein the container is configured to assure a single orientation of wafer frames when placed in the container.

Description of the Prior Art

Semiconductor wafer storage and shipping containers are generally designed for ease of access and/or wafer safety. U.S. Pat. No. 4,043,451 by Johnson describes a shipping container for semiconductor wafers in the form of an elongated enclosure and lid, with interior ribs for locating the wafers lined with resilient curved wafer support material. Rotational positioning of the wafers is not addressed. A container with similar features is disclosed in U.S. Pat. No. 6,499,602 B2 by Yajima et al., providing a slot for each wafer, but not addressing wafer rotational positioning. U.S. Pat. No. 6,550,619 B2 by Bores et al. discloses a container for stacked wafers with improved resistance to shock. U.S. Pat. No. 6,218,727 B1 by Merkl et al. discloses a container, and describes a wafer frame. The container has parallel slots on either of two interior opposing walls for holding a wafer frame with linear sections on opposite edges for achieving support when placed in the container slots.

SUMMARY

An advantage of this invention is that provides for an automatic alignment of wafers in a wafer container.

A further advantage of this invention is that in providing alignment of wafers in a storage container, it reduces the degree of effort required in procedures requiring transferring of wafers from a container and into an aligned position for processing.

In one embodiment of the present invention, an injection molded container for storing and transporting wafers includes a base having a wafer area upon which to place a stack of wafer assemblies, wherein each wafer assembly includes a wafer frame and an attached wafer. A protective wall apparatus is positioned around the wafer area, and includes at least one wall wafer orientation artifact. Each wafer frame according to the invention includes a corresponding opposite/mating artifact. The wall apparatus and wafer frame are configured so that the wafer frame must be oriented to mate the wall and frame artifacts in order for the wafer frame to be installed in the container.

DESCRIPTION OF THE PREFERRED EMBODIMENTS

While the present invention will be described herein with reference to particular embodiments thereof, a latitude of modifications, various changes and substitutions are intended, and it will be appreciated that in some instances some features of the invention will be employed without a corresponding use of other features without departing from the spirit and scope of the invention as described with respect to the preferred embodiments set forth herein.

Figure 1A:
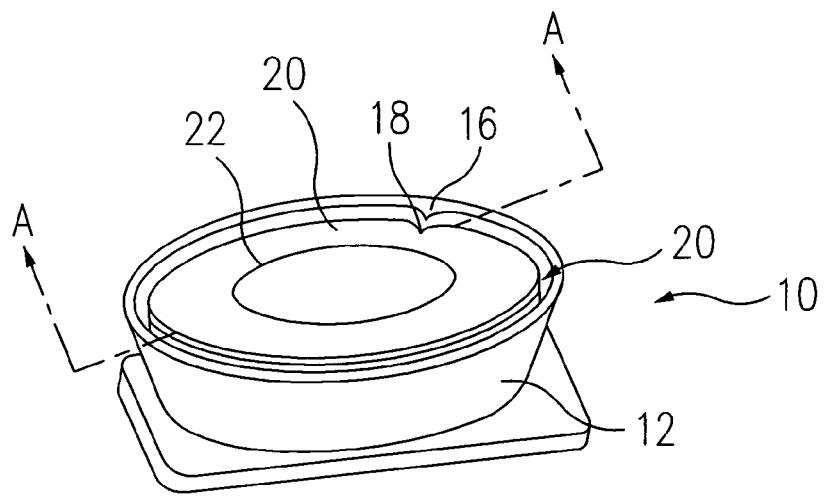
FIG. 1A is a simplified drawing for illustrating wafer assembly orientation control according to the present invention.

The concept of the present invention is illustrated in FIG. 1A which is a simplified drawing for use in describing the invention. A container 10 has a protective wall apparatus 12 extending upward from a base 14, and includes at least one wafer orientation artifact 16 which can be either a protrusion 16 as shown or a recess, or other apparatus for an engagement with a corresponding opposite mating alignment artifact 18, which is an artifact in a wafer element which can be a wafer frame 20 as shown, or it can be an artifact in a wafer, in either case for determining the position orientation of the wafer element (wafer or wafer frame) in the container 10. In this case where a wafer frame 20 is used, a wafer 22 can be secured to each of the frames 20, and the orientation artifact 16 and alignment artifact 18 can therefore be used to determine the orientation of the wafer 22 when the wafer 22 is placed in the wafer frame with a known orientation relative to the artifact 18. A wafer and frame, or just a wafer without a frame will be referred to generally/generically as a wafer element. The wall apparatus 12 can be of any configuration for providing protection to the wafers 22 in the container 10. The wall can be continuous, as shown, or it can be a plurality of sections.

Figure 1B:
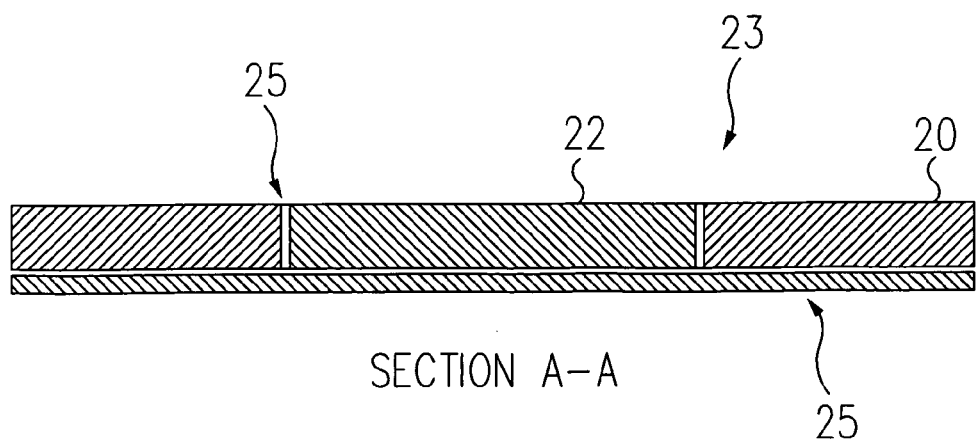
FIG. 1B is a cross sectional view from FIG. 1A for illustrating a method of attaching/mounting a wafer to a wafer frame.

FIG. 1B is a cross sectional view A—A of a wafer element 23 that includes a wafer frame 20 and a wafer. The wafer frame is in the general shape of a ring with a hole 25 there-thru into which is placed a wafer 22. FIG. 1B is presented in order to describe a method of attaching a wafer 22 to a frame 20. The attachment as shown in FIG. 1B is accomplished using an adhesive film 25, placed with an adhesive surface in contact with a bottom surface of the frame 20, as well as with a bottom surface of the wafer 22. The use of tape 25 is well understood by those skilled in the art for the purpose of securing a wafer 22 within a frame 20. The tape 25 generally covers substantially all of the bottom surface of the frame, as well as the entire bottom surface of the wafer. The tape normally used has a characteristic (example blue color) that it does not absorb laser energy used to cut a wafer. In some applications, the tape is applied to the frame, then a wafer is placed in the hole 25 on the adhesive of the tape. If the wafer is to be diced, a laser is then used to cut the wafer into separate parts. The tape remains undisturbed by the cutting of the wafer. A typical thickness of the wafer frame is 0.030 inches.

In one embodiment of the present invention the container is formed by an injection molding process. In this case, the walls would generally include a draft angle. This is described below and illustrated in reference to FIGS. 2A and 2B.

Figure 2A:
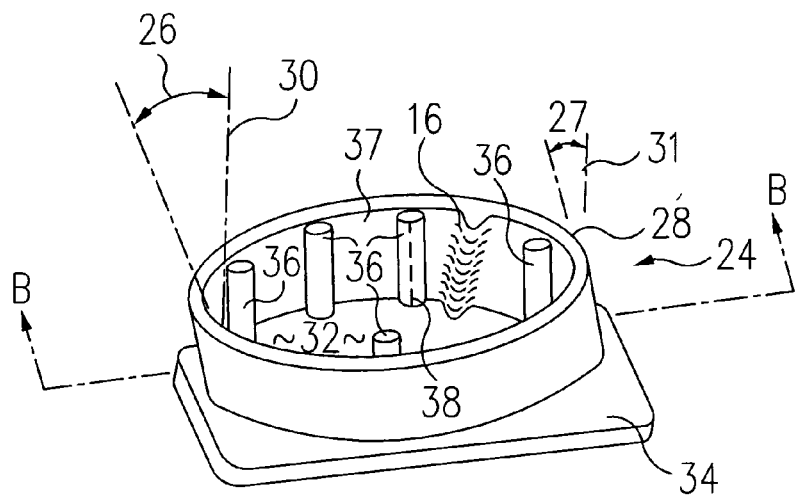
FIG. 2A shows a container having walls with a draft angle, and columns with vertical lines of contact.
Figure 2B:
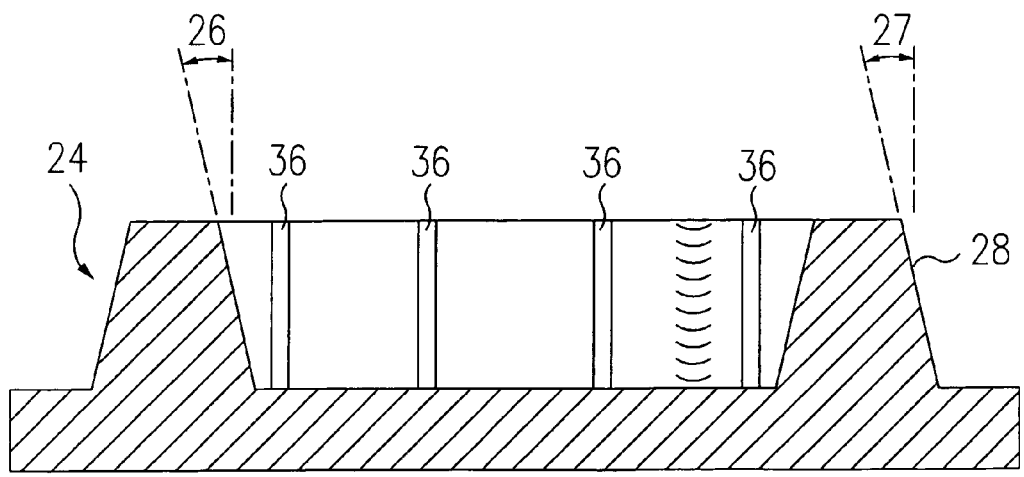
FIG. 2B is a cross sectional view for illustrating the draft angles.

FIG. 2A shows an alternate embodiment of a container 24 wherein the wall apparatus includes a draft angle, simply illustrated as angle 26 of the interior surface and angle 27 of the exterior surface of wall 28. Lines 30 and 31 represent lines orthogonal to a plane, referred to as a wafer area 32, upon which the stack of wafer elements are placed. The use of a draft angle 26 is in conformance with standard practice in injection molding, and is often a small angle in the range of 1–5 degrees. This method of construction applies as one embodiment of the container of the present invention. The draft angle is generally required in order for a product to be easily separated from a mold. A container that has walls with a draft angle has an interior width that is wider at the top than at the bottom of the container. As a result of the interior wall 37 having a draft angle, the distance between a wafer element i.e., a wafer, or wafer frame if a frame is used, and the wall increases in proportion to the distance of the wafer element from the wafer area 32. This increased spacing in prior art containers allows more movement of the wafer elements, and is undesirable. FIG. 2B is a cross sectional view B—B that more clearly shows the draft angles 26 and 27 of the interior and exterior walls respectively.

FIG. 2A serves to illustrate an alternate embodiment of the present invention for solving the problem of the increased spacing with increased wafer element distance from the wafer area when the wall has a draft angle. Columns 36 are placed around the wafer area 32 providing a vertical line of contact for restricting movement of wafer elements in the container that would otherwise occur due to the draft angle causing a larger distance between the wall 28 and wafer elements as described above. A dashed-line 38 is used in FIG. 2A on one of the columns 36 to illustrate a surface line of contact on the column for restricting movement of all of the wafer elements in a stack equally from the bottom of the stack to the top of the stack. The columns can be of various configurations of any structure that provides a vertical line of contact, and can for example be integrally molded with the wall structure. The wall 28 can be a continuous wall, or a plurality of wall sections of various possible configurations. Although the vertical line of contact does not have a draft angle, the resulting vertical area is very small, i.e. insubstantial compared to the total wall area, and as a result the vertical portion does not cause sufficient resistance to defeat removal of the container from the mold.

Figure 3:
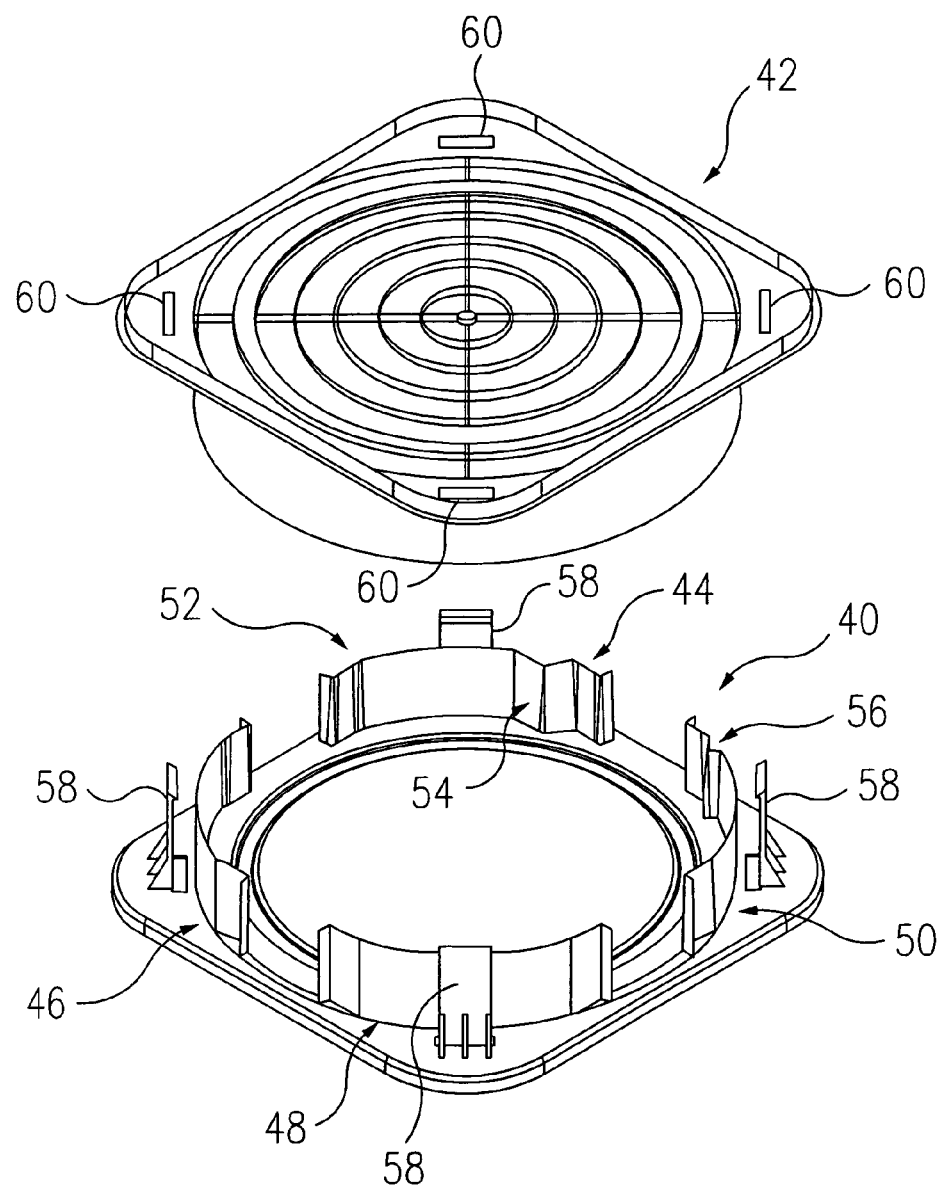
FIG. 3 shows a container constructed according to the present invention, and a cover.

FIG. 3 shows a container 40 designed according to the present invention and a container cover 42. The wall apparatus 44 of container 40 has four sections, 46, 48, 50 and 52. According to the present invention, specific irregular contours that will be referred to as orientation artifacts are integrally formed with walls of this embodiment and mate with corresponding alignment artifacts in the wafer elements to be placed in the container. The particular embodiment as shown in FIGS. 3, 4 and 5 is for use with a wafer element that includes a frame with a wafer (whole or diced). The present invention also applies to wafer elements including only a wafer with at least one artifact. In this latter case, the container would be configured to conform to the wafer which would generally be round, with at least one artifact. Referring now to the specific embodiment, the artifacts, as will be described assure that all of the wafer elements, each including a wafer frame and a wafer in this particular embodiment, are oriented the same in the container 40, therefore making it possible for all of the wafers to be in known orientations, assuming that they are oriented relative to the wafer frame alignment artifact.

As shown in FIG. 3, the artifacts that assure only one orientation for a wafer frame, are portions 54 and 56. FIG. 3 also shows four prongs 58 for insertion through slot 60 in the cover 42 for holding the cover 42 onto the container 40.

Figure 4A:
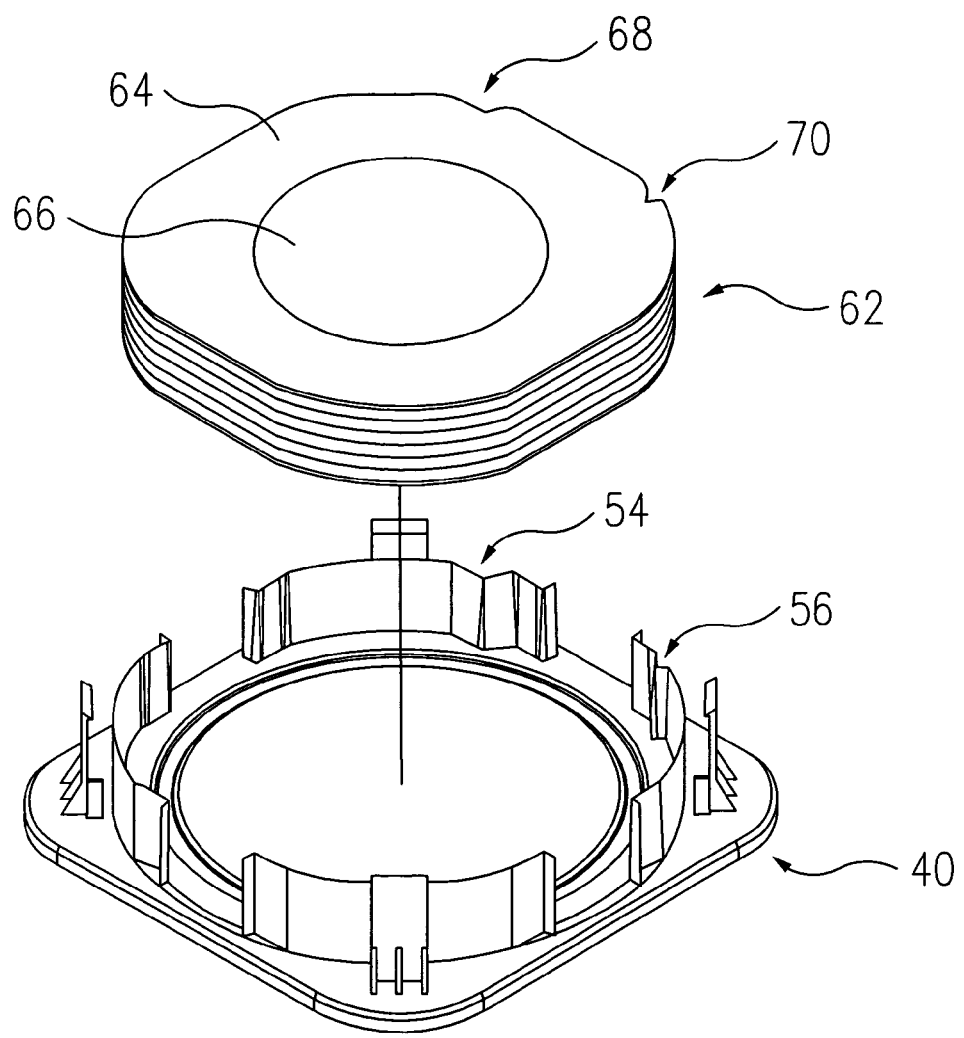
FIG. 4A shows a stack of wafer assemblies in position for placement in a container.
Figure 4B:
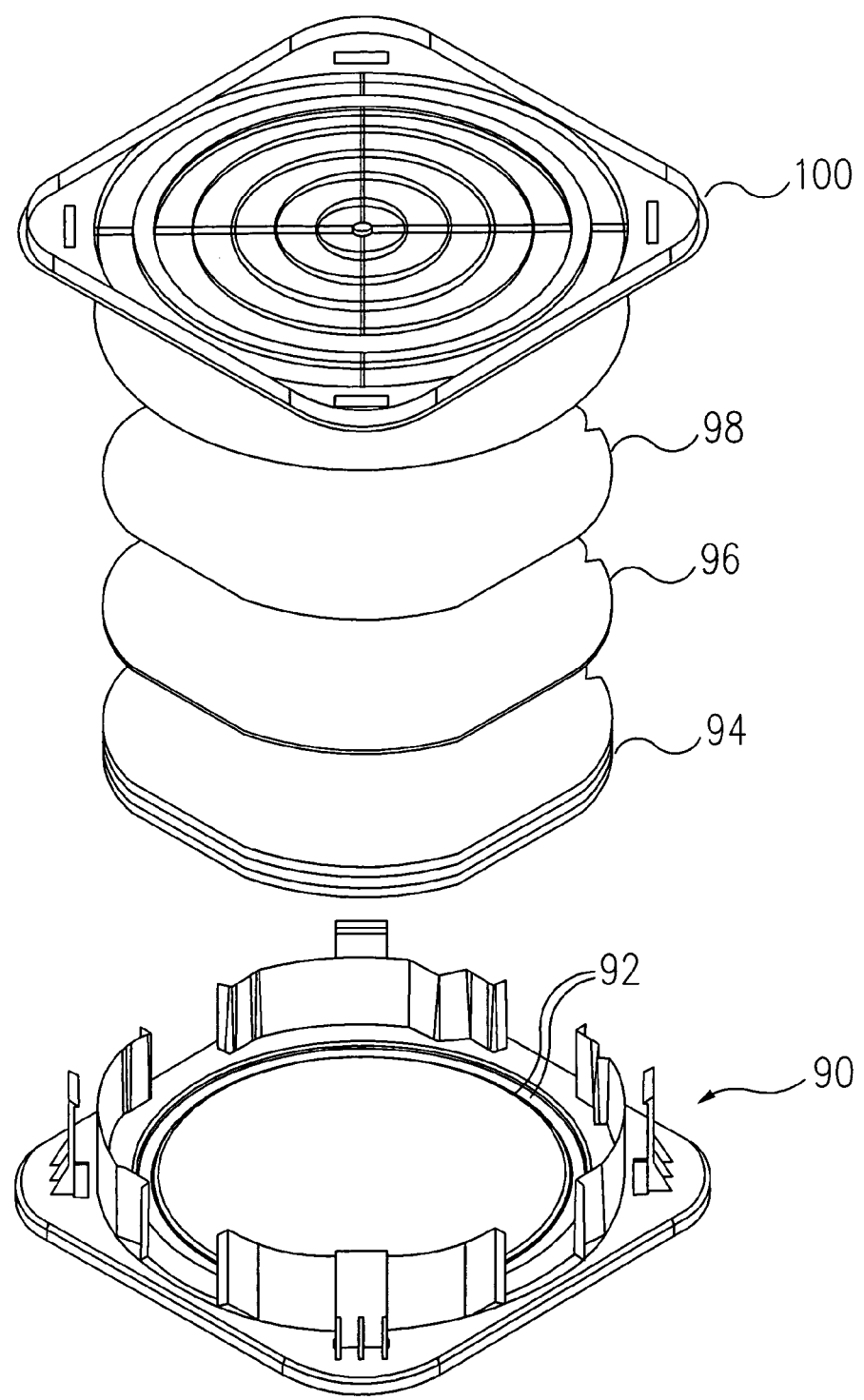
FIG. 4B illustrates wafer element separators.
Figure 5:
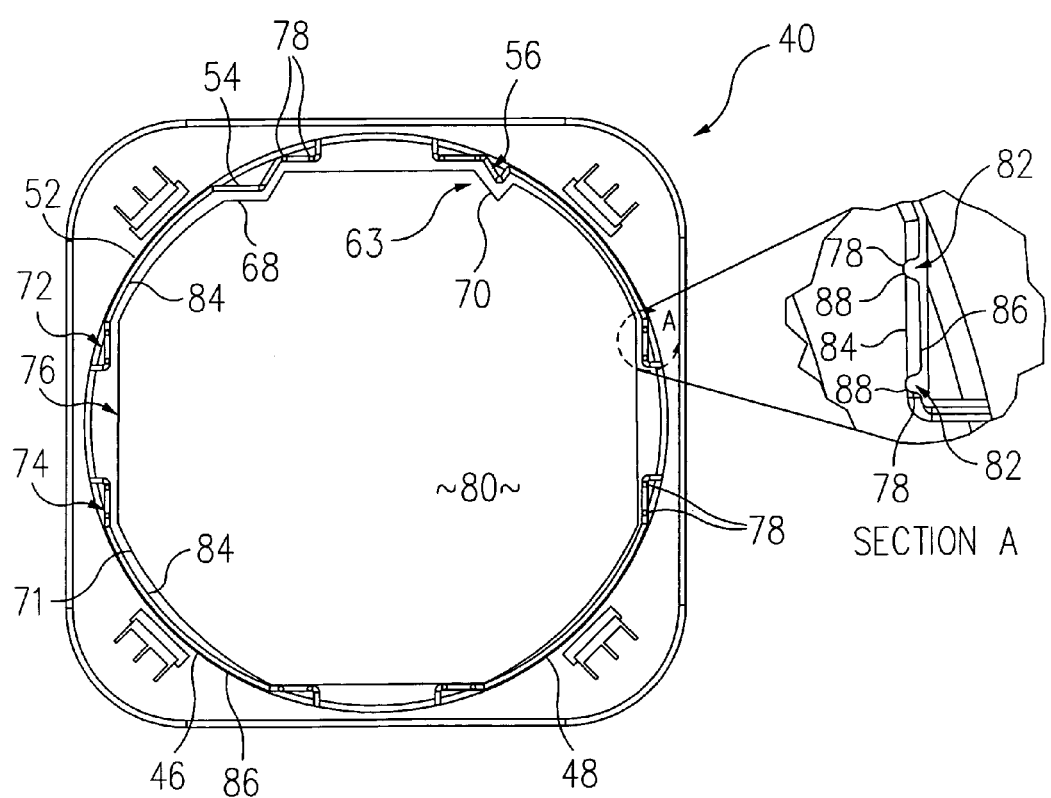
FIG. 5 is a top view of the container of FIGS. 3 and 4.

FIG. 4A shows a stack 62 of wafer elements, including frames 64 with wafers 66 attached. Each wafer frame 64 has an alignment artifact 68 for mating with an orientation artifact 54 of container 40, and an alignment artifact 70 for mating with a corresponding container mating orientation artifact 56. The stack 62 of wafer elements of FIG. 4A, and generally for any stack, will include some form of separators between each wafer element. The separators may be for example thin disks constructed of paper or foam, and/or a carbon/carbon impregnated material. Such an arrangement using all of the above is illustrated in FIG. 4B, wherein a container 90 has a wafer element 92 placed therein, with a carbon interleaf 94, a foam interleaf 96, and a paper interleaf 98 in position for placement on top of the wafer element 92. A cover 100 is also shown.

FIG. 5 is a top view of the container 40 of FIGS. 3 and 4A, and illustrates more clearly various features of the present invention. An outline 71 of a frame, such as frame 64 of FIG. 4, is shown in the container 40. Frame contour artifacts 68 and 70 are shown mated with the wall structure/apparatus contour artifacts 54 and 56 respectively. It should be noted that only one of the container orientation artifacts 54 or 56 and corresponding wafer frame alignment artifacts 68 or 70 are needed in order to assure only one orientation possible for a frame in the container. Alternatively, if the wall sections 46, 48, 50 and 52 conform to a common circle, then a single irregularity/artifact would need to be asymmetrical, i.e., lacking in symmetry in order to assure that a frame could not be inserted upside down. The particular wall sections 46, 48, 50 and 52, as shown each have flat surfaces which by themselves would force orientation of the frame to be in one of four positions. For example, flat surfaces 72 and 74 of the wall structure conform to a flat portion 76 of the frame. In such a configuration, it is still necessary for there to be at least one artifact such as 54 or 56 placed asymmetrically, in order to assure only one orientation of the frame in the container, and to assure that the frame could not be installed upside down. Various configurations for accomplishing the objective of the present invention as disclosed will be apparent to those skilled in the art, and these are to be included in the spirit of the present invention.

According to an alternate embodiment, as described above the container can also include walls with a draft angle, and with columns for restricting movement of the wafer assemblies. FIG. 5 also illustrates these alternate embodiments, including 16 columns 78 shown as structures that are integrally molded with the wall sections 46–52. The columns 78 all have a surface designed to provide a vertical line of contact, i.e., orthogonal to the plane of the wafer area 80 for restraining lateral movement of the wafer assemblies over the entire stack height. The lines of contact have a vertical orientation extending upward at a right angle relative to the plane of the wafer area 80 upon which a stack of wafer assemblies are to be placed. Because the columns 78 in FIG. 3 are integrally molded with the wall sections, and due to the vertical/orthogonal direction of the lines of contact i.e. no draft angle on the line of contact, the columns 78 appear wider in the view of FIG. 5 near the top of the wall structures than at the bottom of the wall at the base 80 level.

The top surfaces 82 of each column provide a substantial point of contact for pressuring the container for removal from a mold.

The draft angle of the wall sections 46, 48, 50 and 52 is evident by the line 84 indicating the inside perimeter of the wall section at the level of the bottom of the wall sections. Line 86 indicates the inner perimeter of the wall section at the top of the wall, which clearly lies outside the line 84, therefore indicating the draft angle. This detail is more clearly shown in the enlargened section A Section A also shows columns 78 more clearly. Note that the top view of FIG. 5 shows only a single line 88 passing across the line of contact i.e. the vertical line which would contact a wafer or wafer frame. The single line 88 indicates that the line of contact is perpendicular to the base 80, and therefore the line of contact does not show in the top view of FIG. 5. In contrast, the two lines 84 and 86 indicate the draft angle of the wall sections 46, 48, 50, 52.

While the present invention has been described herein with reference to particular embodiments thereof, a latitude of modifications, various changes and substitutions are intended in the foregoing disclosure, and it will be appreciated that in some instances some features of the invention will be employed without a corresponding use of other features without departing from the spirit and scope of the invention as set forth in the appended claims.

The invention claimed is:

1. A method of storing a stack of wafers in a wafer storage container, the method comprising the steps of:
   providing a plurality of wafer elements, each wafer element having at least one alignment artifact on a wafer frame;
   providing a container that conforms to the outer dimension of the wafer elements, wherein the container includes at least one orientation artifact that is capable of engagement with an alignment artifact of each wafer element;
   placing the wafer elements in the container so that the alignment artifact of each wafer element mates with at least one orientation artifact of the container.

2. The method of storing a wafer stack in the wafer storage container of claim 1, wherein each wafer element has an orientation that is visible when the chamber is uncovered.

3. The method of storing a wafer stack in the wafer storage container of claim 1, wherein each wafer element has a known orientation that is visible when the chamber is uncovered.

4. The method of claim 1 wherein the step of placing the wafer elements into the wafer storage chamber comprises aligning a plurality of alignment artifacts with a corresponding plurality of orientation artifacts disposed within the wafer storage chamber.

5. A method of storing a plurality of wafers in a stack within a wafer storage container, the method comprising the steps of:
   placing each wafer of said plurality of wafers on a corresponding wafer frame to obtain a plurality of wafer assemblies, each wafer frame including at least one alignment artifact disposed thereon, the step of placing resulting in adhesion between each wafer and corresponding wafer frame sufficient to prevent substantial movement of the wafer relative to the corresponding wafer frame;
   sequentially placing each wafer assembly into a wafer storage chamber to form a stack wherein each wafer assembly has a known orientation that is visible when the chamber is uncovered, the step of sequentially placing including the step of engagement of the at least one alignment artifact disposed on each wafer frame with at least one orientation artifact disposed within the wafer storage container, thereby orienting each wafer frame in the wafer storage container and preventing substantial rotational movement of each wafer frame and the wafer disposed thereon within the storage chamber; and
   covering the wafer storage chamber with a cover to fully enclose the stack.

6. The method of claim 5 wherein the step of placing comprises placing an adhesive film over an open area of each wafer frame.

7. The method of claim 5 wherein the step of placing further comprises the step of placing each wafer on the adhesive film.

8. The method of claim 5 wherein the step of sequentially placing each wafer assembly into the wafer storage chamber to form the stack comprises aligning a plurality of alignment artifacts disposed on each wafer frame with a corresponding plurality of orientation artifacts disposed within the wafer storage chamber.

* * * * *